(12) United States Patent
Agarwal et al.

(10) Patent No.: US 11,009,549 B2
(45) Date of Patent: *May 18, 2021

(54) MULTIBIT VECTORED SEQUENTIAL WITH SCAN

(71) Applicant: Intel Corporation, Santa Clara, CA (US)

(72) Inventors: Amit Agarwal, Hillsboro, OR (US); Ram Krishnamurthy, Portland, OR (US); Satish Damaraju, El Dorado Hills, CA (US); Steven Hsu, Lake Oswego, OR (US); Simeon Realov, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/681,691

(22) Filed: Nov. 12, 2019

(65) Prior Publication Data

US 2020/0150179 A1 May 14, 2020

Related U.S. Application Data

(63) Continuation of application No. 15/846,047, filed on Dec. 18, 2017, now Pat. No. 10,473,718.

(51) Int. Cl.
| | |
|---|---|
| *G01R 31/317* | (2006.01) |
| *G01R 31/3177* | (2006.01) |
| *H03K 3/037* | (2006.01) |
| *G01R 31/3185* | (2006.01) |

(52) U.S. Cl.
CPC ... *G01R 31/31723* (2013.01); *G01R 31/3177* (2013.01); *G01R 31/31727* (2013.01); *G01R 31/318541* (2013.01); *H03K 3/0372* (2013.01)

(58) Field of Classification Search
CPC ........ G01R 31/31723; G01R 31/31727; G01R 31/3177; G01R 31/318541; H03K 3/0372
See application file for complete search history.

(56) References Cited

U.S. PATENT DOCUMENTS

| | | | |
|---|---|---|---|
| 7,139,957 B2 | 11/2006 | Querbach et al. | |
| 10,473,718 B2* | 11/2019 | Agarwal | H03K 3/0372 |
| 2003/0226077 A1 | 12/2003 | Zyuban et al. | |
| 2016/0241219 A1 | 8/2016 | Kim et al. | |

(Continued)

OTHER PUBLICATIONS

S. Ahlawat, J. Tudu, A. Matrosova and V. Singh, "A high performance scan flip-flop design for serial and mixed mode scan test," 2016 IEEE 22nd International Symposium on On-Line Testing and Robust System Design (IOLTS), Sant Feliu de Guixols, 2016, pp. 233-238. (Year: 2016).*

(Continued)

*Primary Examiner* — Cynthia Britt
(74) *Attorney, Agent, or Firm* — Green, Howard & Mughal LLP

(57) ABSTRACT

An apparatus is provided which comprises: a multi-bit quad latch with an internally coupled level sensitive scan circuitry; and a combinational logic coupled to an output of the multi-bit quad latch. Another apparatus is provided which comprises: a plurality of sequential logic circuitries; and a clocking circuitry comprising inverters, wherein the clocking circuitry is shared by the plurality of sequential logic circuitries.

24 Claims, 12 Drawing Sheets

(56) References Cited

U.S. PATENT DOCUMENTS

2017/0359054 A1* 12/2017 Hsu ................ G01R 31/318541
2018/0278243 A1* 9/2018 Agarwal ................ H03K 19/20

OTHER PUBLICATIONS

Notice of Allowance from U.S. Appl. No. 15/846,047 notified Jul. 5, 2019, 10 pgs.
Zyuban, Victor, "Optimization of Scannable Latches for Low Energy", IEEE Transactions on Very Large Scale Integration (VLSI) Systems, vol. 11, No. 5, Oct. 2003, 11 pgs.

* cited by examiner

| | D-to-Q delay | Std. Cell Pins | Std. Cell Area | Clock Pin-Cap | Internal Clock Power |
|---|---|---|---|---|---|
| Conventional MBQL with LSSD Scan | same | 25 | 1.0 | 10.0 | 18.0 |
| Integrated MBQL with LSSD Scan | same | 13 | 0.92 | 2.0 | 20.0 |

US 11,009,549 B2

MULTIBIT VECTORED SEQUENTIAL WITH SCAN

CLAIM OF PRIORITY

This Application is a Continuation of, and claims priority to, U.S. application Ser. No. 15/846,047, filed on Dec. 18, 2017 and titled "MULTIBIT VECTORED SEQUENTIAL WITH SCAN," which is incorporated by reference in its entirety for all purposes.

BACKGROUND

Area-efficient designs for modern microprocessors, DSP's (Digital Signal Processors), SoC's (System-on-Chip) in wearables, IoTs (Internet-of-Things), smartphones, tablets, laptops, and servers, etc., are increasingly becoming a critical factor due to the following requirements: reducing silicon cost, decreasing PCB (Printed Circuit Board) footprint, improving time-to-market (TTM), and slower scaling cadence of process technology node. These requirements all need to be met while meeting the stringent frequency and/or performance targets and power/leakage budgets.

The standard cell and fundamental building block of any digital integrated circuit is the latch or flip-flop, which is used to store a state in any sequential logic. Each latch or flip-flop may include testability circuit hooks such as Level-Sensitive Scan Design (LSSD). These extra circuits that are only used for testing (e.g., design for test (DFT)) can consume approximately, for example, 70% of the standard cell size of a latch, therefore are a significant overhead.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
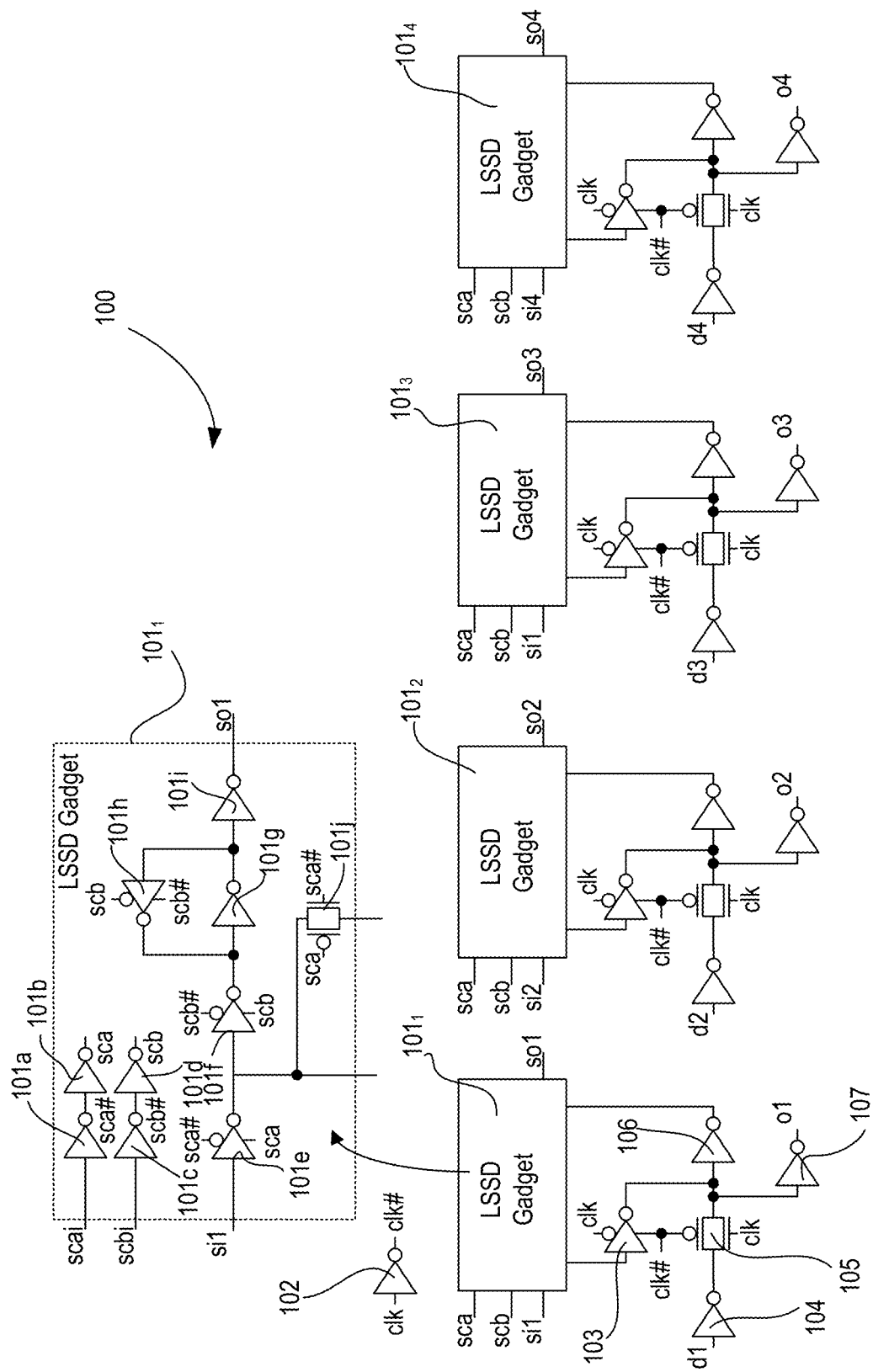
FIG. 1 illustrates a conventional multi-bit quad latch (e.g., transparent during high phase) with LSSD scan.

It is common to combine latches or flip-flops into one multi-bit standard cell with shared local clock inverters to reduce power. These latches and flip-flops account for a large percentage of the area (e.g., greater than 30%) and power in the clock tree and final sequential load (e.g., greater than 30%), therefore it is useful to reduce flip-flop area and power due to the strong impact it has on the overall design. Since these multi-bit latches or flip-flops with LSSD scan are now in a single standard cell, the standard cell can be re-optimized to eliminate redundant transistors and standard cell pins, and reduce area. Furthermore, clock pin-cap can be reduced without impacting D-to-Q delay of the latch.

Some embodiments address the above design concerns (e.g., area and power) by extending the idea of multi-bit latch and flip-flop design. Multi-bit latches and flip-flops with LSSD scan enables scan clocks, inputs, and outputs to be internally connected using local metal. Also, it enables removing unnecessary transistors to reduce area. Furthermore, clock pin capacitance can be reduced by inserting a local clock inverter without affecting the D-Q (data-to-output) delay of the latch.

There are many technical effects of the various embodiments. For example, the multi-bit latch or flip-flop with LSSD has lower area compared to conventional multi-bit counterpart, has reduced scan clock, has fewer number of input and output pins to reduce pin density compared to conventional multi-bit counterpart, has reduced clock pin to reduce downstream clock power and no D-to-Q penalty. Other technical effects will be evident from the various embodiments and figures.

Time borrowing flip-flops (TBFF) have been traditionally used to improve maximum delay convergence by using them as a means to fix outlier maximum delay paths, helping to bring those paths closer to the overall timing wall. These flip-flops can reduce/remove process variation tax, clock skew/jitter tax or fix timing violations resulting in higher frequency. The high frequency gain can easily be converted into lower power by reducing the supply voltage. The TBFF are designed by inserting clock inverters between master and slave by delaying the master. This results in opening up a transparency window between the master and slave latches, allowing a continuous trade-off between setup time and clock-to-out delay, which can be used to improve circuit performance. The use of TBFF has typically proven to be a challenge due to the relatively high dynamic power cost on a per-bit basis and the lack of area compatibility between traditional and time-borrowing flip-flops, making TBFF insertion in after-design or debug mode difficult.

Some embodiments address both of these design concerns (e.g., area and power) by extending the idea of TBFFs to a vectored flip-flop design. The vectorizing of FFs amortizes the clock power overhead needed to generate the internally delayed clock signals across the number of bits, making the cost of time-borrowing less on a per-bit basis. Additionally, the layout design of vectored sequential units typically tends to have more white-space (e.g., unused area) than their single-bit counterparts due to sharing of devices between the bits. These white-spaces are leveraged to fit in the additional clock inverters needed without having to grow the overall cell area.

There are many technical effects of the TBFF of various embodiments. For example, time-borrowing vectored flip-flop of some embodiments has lower dynamic power cost compared to conventional single bit time borrowing flip-flop. The vectored TBFF of some embodiments fits into the same layout area as its non-TB counterpart, which enables swapping of TBFF after placement and route during after-design or debug mode. In some example, D-to-Q gain is achieved (e.g., 32% D-to-Q delay gain) to fix outlier maximum delay paths. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates a conventional multi-bit quad latch 100 (e.g., transparent during high phase) with LSSD scan. Latch 100 consists of four separate LSSD gadgets 101$_{1-4}$ such that each latch is coupled to one LSSD gadget. Each LSSD gadget here consists of six pins including scai (scan control input a), scbi (scan control input b), si1 (scan input 1), so1 (scan output 1), scan-to-latch hook-up 1, and scan-to-latch hook-up 2. Here, scan-to-latch hook-up 1 is the output of tri-statable inverter 101e, while scan-to-latch hook-up 2 is the output of pass-gate 101j. The devices of LSSD gadget include inverters 101a, 101b, 101c, 101d, 101g, and 101j; tri-statable inverters 101e, 101f, and 101h; and pass-gate 101j. Inverter 101a generates sca # (e.g., inverse of scai) while inverter 101b generates a buffered version of scai as sca. Likewise, inverter 101c generates scb # (e.g., inverse of scbi) while inverter 101d generates a buffered version of scbi as scb. The scan input sli is received by tri-statable inverter 101e which provides an inverted version of si1 to the latch when sca and sca # are logic 1 and logic 0, respectively.

Each latch consists of five pins including data pin d1, output pin o1, clock pin clk, and two pins to hook-up to the LSSD gadget. The memory component of the latch is the feedback loop formed by inverter 106, pass-gate 101j, and clock controlled inverter 103. Inverter 107 is the output driving inverter while pass-gate 105 controls the hold and transparency aspect of the latch. Input data d1 is received by inverter 104 which drives the pass-gate 105 when the pass-gate is open. Clock inverter 102 generates the inverted version of clock clk as clk #. In this quad latch example, the latch is transparent during high phase.

When the quad latch 100 is used as a standard library cell, it results in a large footprint (e.g., layout pitch in the x-y direction) because of the at least 22 pins, routings between the pins, and extra gates because of the way each latch is provided with its own LSSD gadget. A larger area or footprint results in higher power consumption.

Figure 2:
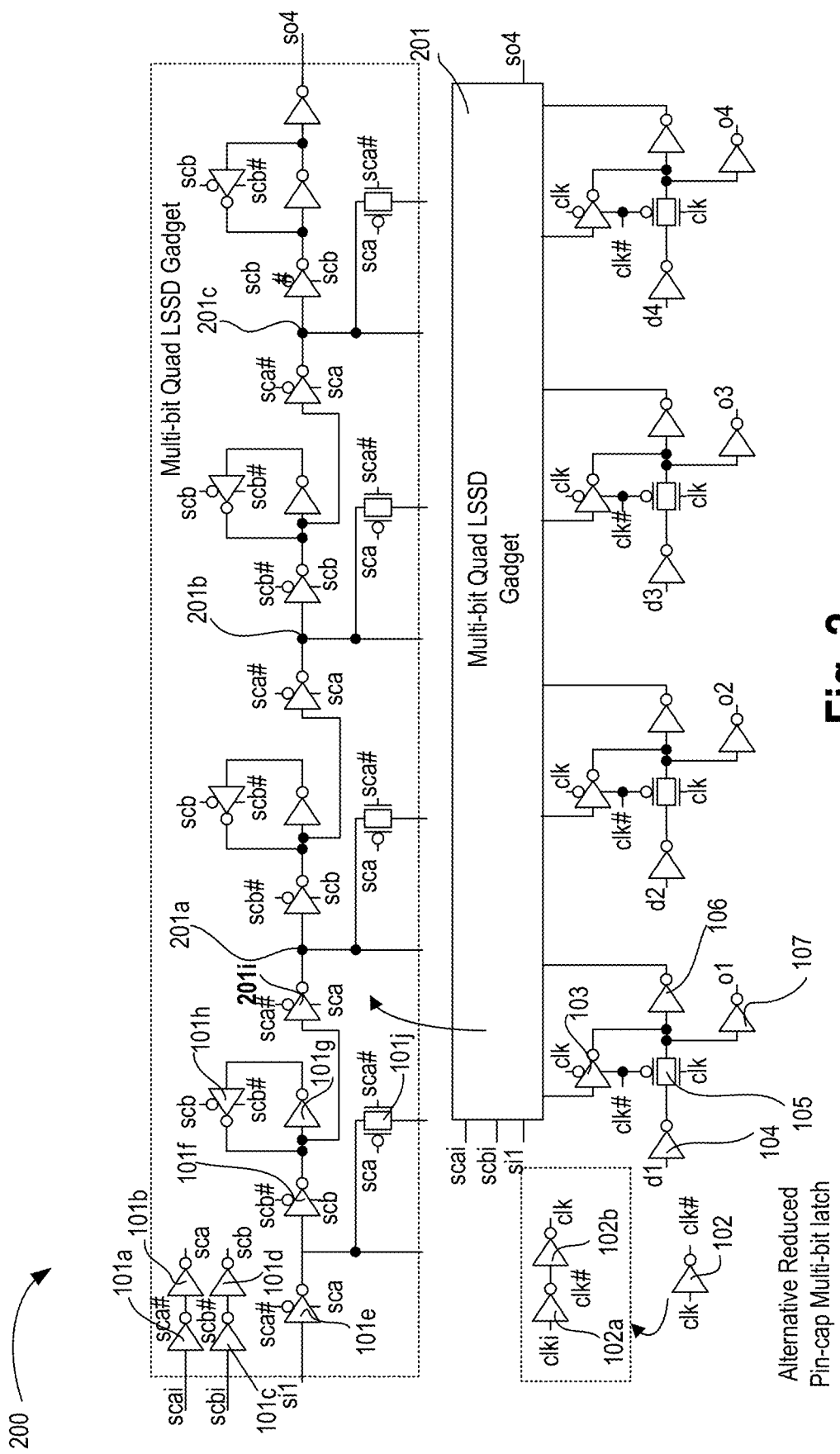
FIG. 2 illustrates a multi-bit quad latch with integrated LSSD scan, in accordance with some embodiments of the disclosure.

FIG. 2 illustrates a multi-bit quad latch 200 with integrated LSSD scan, in accordance with some embodiments of the disclosure. In some embodiments, by extending the idea of multi-bit latch and flip-flop design, both of these design concerns (e.g., area and power) are mitigated. Multi-bit latches and flip-flops with LSSD scan such as latch 200 enable scan clocks, inputs, and outputs to be internally connected using local metal. Also, it enables removing unnecessary transistors to reduce area. Furthermore, clock pin capacitance can be reduced by inserting a local clock inverter without affecting the D-Q of delay of the latch.

In some embodiments, for a quad latch, four separate scan gadgets are combined into a single quad multi-bit LSSD scan gadget. By creating a single scan gadget, the scan clock, input, and output pins can be connected internally in lower level metal layers. Here, the multi-bit quad LSSD gadget 201 comprises four bit-cells that are integrated in a sequential matter. Each bit-cell of gadget 201 comprises inverter 101f, memory element including inverters 101g and 101h, output driving inverter 201i, and pass-gate 101j. In some embodiments, the last bit-cell in the sequence has its output driving inverter coupled to an output of inverter 101g of that last bit-cell. In some embodiments, the last bit-cell in the sequence has its output driving inverter coupled to an input output of inverter 101g of that last bit-cell.

In some embodiments, the disparate LSSD gadgets are combined into one multi-bit LSSD gadget 201 which is integrated with the feedback loops of the individual data latches. In this example, each individual data latch can be part of a traditional latch or a flip-flop, or any kind of sequential logic. Here, the individual data latch comprises inverter 104, pass-gate 105, output driver 107, and memory element including inverters 103 and 106. These inverters of the memory element are coupled to the bit-cell of gadget 201.

In some embodiments, the output driving buffer 101i is replaced with tri-stable inverter 201i which is tapped off of the storage node coupled to the output of tristate-able inverter 101d. As such, one inverting stage is removed from the next LSSD gadget cell within multi-bit LSSD gadget 201. For instance, output 201a of tristate-able inverter 201i is now provided to the feedback loop of the next data latch. Likewise, outputs 201b and 201c are coupled to the feedback loops of the other data latches. In some embodiments, the clock buffer 102 is shared between all data latches or cells. In some embodiments, inverters 101a/b/c/d for scan control bits scai and scbi are shared by the entire multi-bit quad LLSD gadget 201.

In this example, instead of 8 scan clock pin inputs, there are now 2 (e.g., scai and scbi), and instead of 4 scan input and 4 scan output pins, there is 1 scan input (si1) and 1 scan output (so4) pins. These standard cell pin reductions result in a reduction of 12 pins, relaxing the pin density of the standard cell greatly. Also, 18 redundant transistors can be removed in the scan gadget, or 4.5 transistors fewer per LSSD scan gadget, for an estimated 12.5% scan gadget area reduction. In an alternative embodiment, an additional clock inverter is inserted at the clock input, reducing the power impact downstream in the clock tree. This can reduce the overall block level power without impacting the D-to-Q delay of the latch.

While the various embodiments show the data latches as regular transparent-capture latches, any type of sequential can be used by integrating the multi-bit quad LSSD to its feedback loop (e.g., the feedback loop of the slave section of a flip-flop). In various embodiments, the output of the quad latch (e.g., any or all of outputs o1, o2, o3, and o4) are then coupled to an input of a combinational logic (not shown).

Figure 3:
FIG. 3 illustrates a table showing performance enhancement using the multi-bit quad latch with integrated LSSD scan over the conventional multi-bit quad latch with LSSD scan of FIG. 1, in accordance with some embodiments.

FIG. 3 illustrates a table 300 showing performance enhancement using the multi-bit quad latch with integrated LSSD scan over the conventional multi-bit quad latch with LSSD scan of FIG. 1, in accordance with some embodiments. Table 300 summarizes the difference between a conventional quad multi-bit latch with LSSD scan vs. the proposed internally stitched. The multi-bit latch or flip-flop 200 with LSSD has lower area compared to conventional multi-bit counterpart. The multi-bit latch or flip-flop 200 with LSSD has reduced scan clock, and reduced number of input and output pins to reduce pin density. The multi-bit latch 200 has reduced clock pins to reduce downstream clock power and no D-to-Q penalty.

Figure 4:
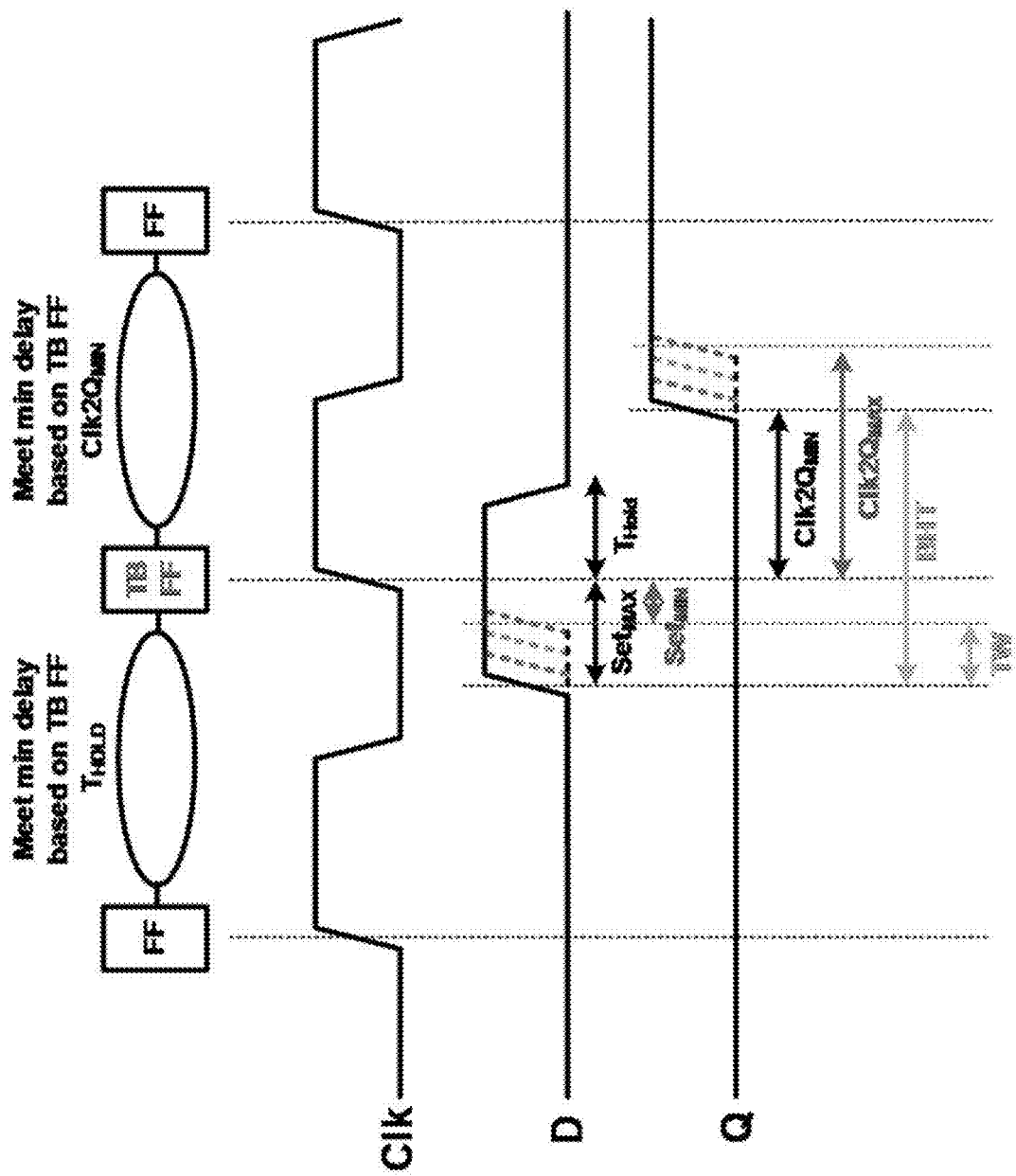
FIG. 4 illustrates a timing diagram for a time borrowing flip-flop.

FIG. 4 illustrates a timing diagram 400 for a time borrowing flip-flop (TBFF). Here, x-axis is time and y-axis is logic levels between 0 (e.g., ground) and 1 (e.g., Vdd). Timing diagram 400 illustrates the timing constraints to be met by a TBFF. Three waveforms are shown here which consist of clock (Clk), data (D), and output (Q). TBFFs have been traditionally used to improve maximum delay convergence by using them as a means to fix outlier maximum delay paths, helping to bring those paths closer to the overall timing wall. These flip-flops can reduce/remove process variation tax, clock skew/jitter tax or fix timing violations resulting in higher frequency. The high frequency gain can easily be converted into lower power by reducing the supply voltage. The TBFF are designed by inserting clock inverters between master and slave by delaying the master. This results in opening up a transparency window between the master and slave latches, allowing a continuous trade-off between setup time (Set) and clock-to-out delay (Clk2Q), which can be used to improve circuit performance.

The term "setup time" generally refers to an amount of time data at a synchronous input D must be stable before an active edge of clock Clk. This is so that the data can be stored successfully in the storage device (e.g., latch or flip-flop). Setup violations can be fixed by either slowing down the clock (e.g., increase its period) or by decreasing the delay of the data path logic. The term "hold time" generally refers to an amount of time the data at the synchronous input D must be stable after an active edge of the clock Clk. Hold violations can be fixed by increasing the delay of the data path or by decreasing the clock uncertainty (also known as skew) if specified in a design.

The clock inverters added in the clock path allow for adjusting the setup-hold window along the x-axis. The setup transparency window is TW (transparency window) which is a difference between a maximum setup time ($Set_{MAX}$) and a minimum setup time ($Set_{MIN}$). The Clk2Q (or clock-to-output) parameter illustrates the time it takes for the flip-flop to output upon an edge of the clock. Generally, a shorter Clk2Q is desired for faster flip-flop operation. Here, maximum Clk2Q is $Clk2Q_{MAX}$ and the minimum Clk2Q is $Clk2Q_{MAX}$. Here BHT stands for Block Hole Time, or the setup time pulse Clk2Q. For example, BHT is for a rising arc setup and Clk2Q. Note, worst case BHT is for the worst setup and worst Clk2Q regardless of the arc.

The use of TBFF has typically proven to be a challenge due to the relatively high dynamic power cost on a per-bit basis and the lack of area compatibility between traditional and time-borrowing flip-flops, making TBFF insertion in design/debug mode difficult.

Figure 5A:
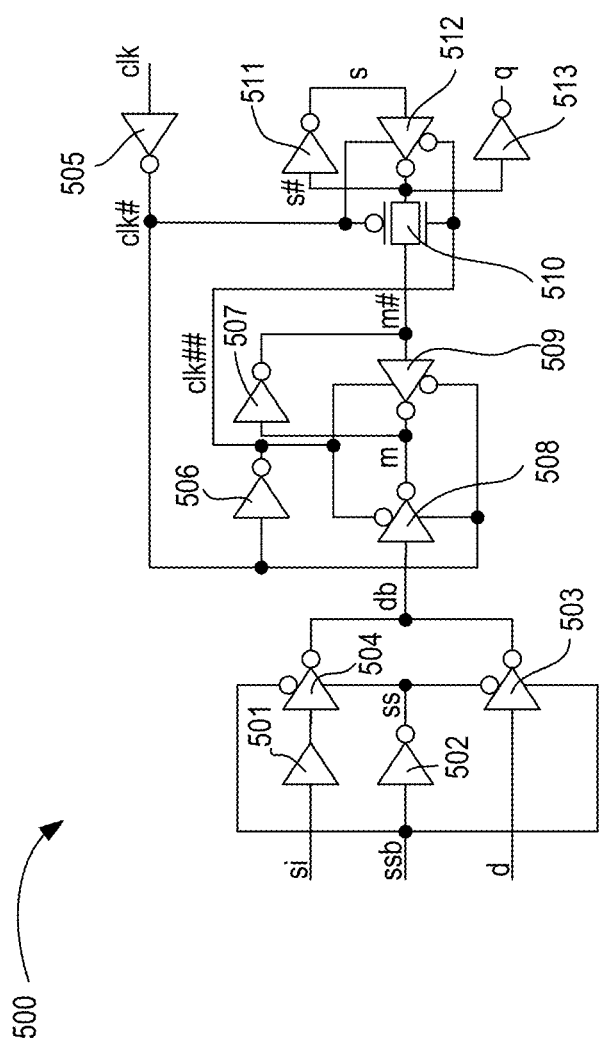
FIG. 5A illustrates a traditional flip-flop.

FIG. 5A illustrates a traditional flip-flop (FF) 500 which comprises a master stage, slave stage, and a scan/data multiplexer. The master stage includes tri-statable inverters 508, 509 and 507. The slave stage includes pass-gate 510, tristate-able inverter 512, inverter 511, and output driver 513. The scan/data multiplexer includes buffer 501, and selectable inverters 504 and 503 which are controlled by signal ss from inverter 502. Here, inverters 505 and 506 provide the clock signals to the master and slave stages.

Depending on the logic level of signal ssb on node ssb, either the scan input si or the data d is provided to node db. Here, signal names and node names are interchangeably used. For example, ssb may refer to signal ssb or node ssb depending on the context of the sentence. Data on node db then passes through the master stage which is controlled by clk # and clk ## (same as clk). The output of the master stage is m # which is input to pass-gate 510. The slave memory element comprises inverters 511 and 512, where s # is the storage node and s is the inverse of s #. The output of the FF is q.

Figure 5B:
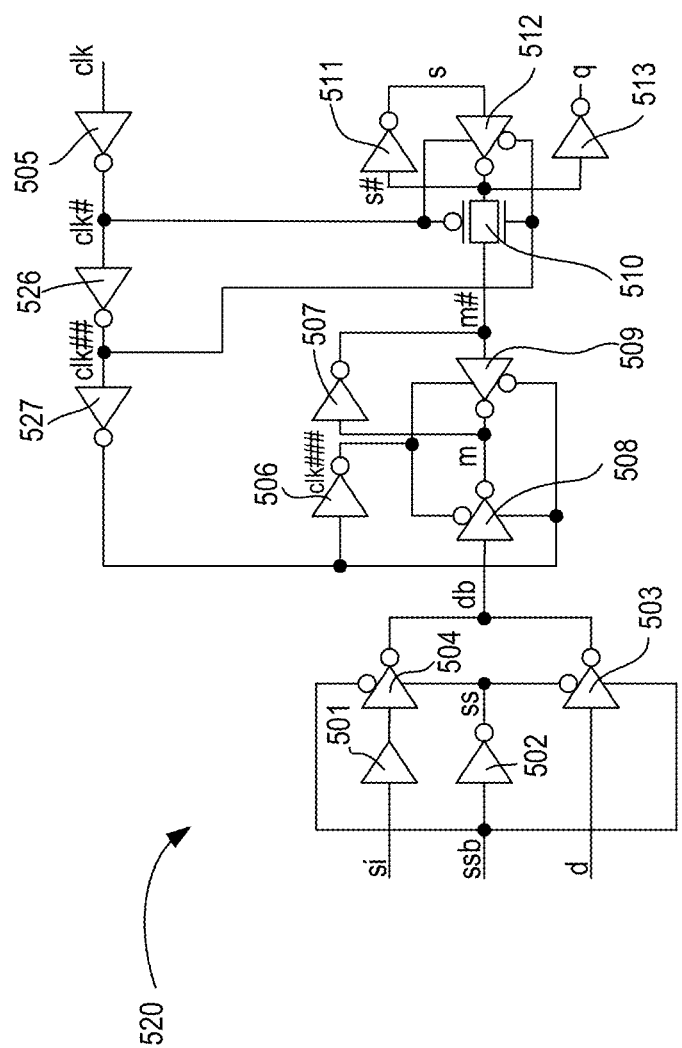
FIG. 5B illustrates a traditional time borrowing flip-flop.

FIG. 5B illustrates a traditional time borrowing flip-flop (TBFF) 520. TBFF 520 is similar to FF 500 but for additional clock inverters 526 and 527 placed between clock inverters 505 and 506. As such, clk #, clk ##, and clk ### are generated. The time-borrowing effect is achieved by adding two more clock inverters 526 and 527 in the internal FF clock distribution such that the master latch clock is delayed with respect to the slave.

Figure 6:
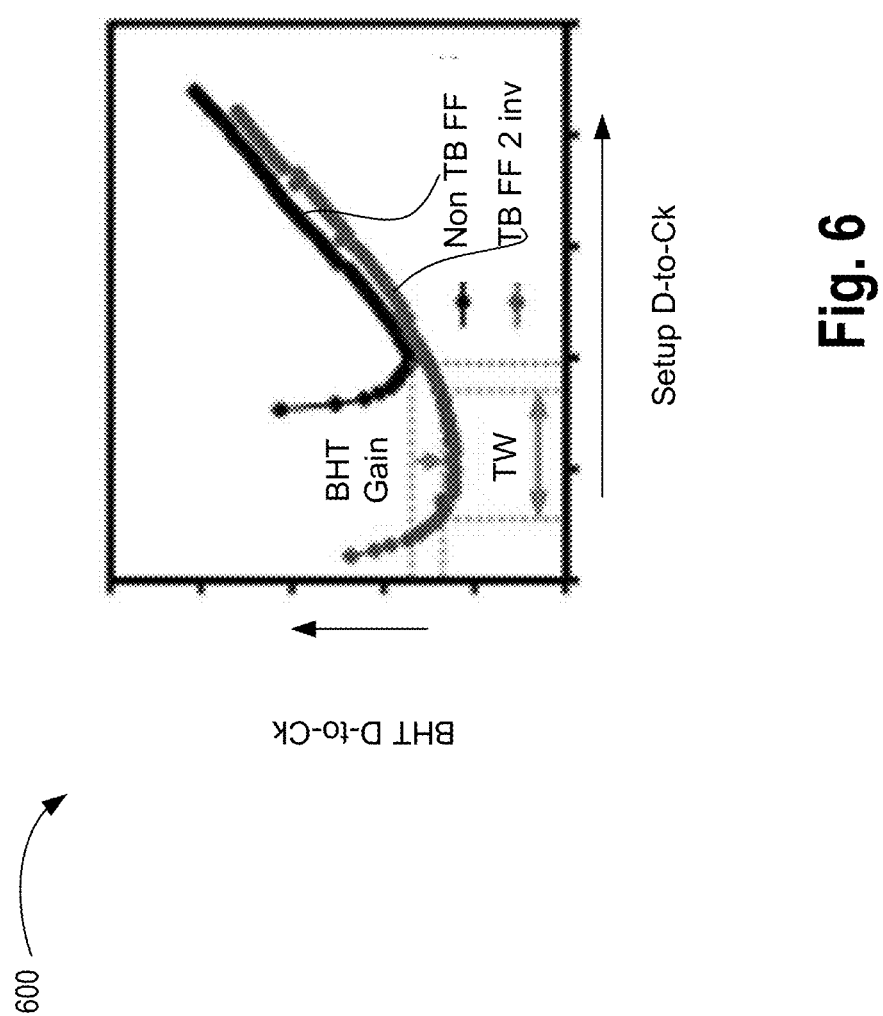
FIG. 6 illustrates a plot comparing timing of traditional vs. time borrowing flip-flop.

FIG. 6 illustrates plot 600 comparing timing of traditional vs. time borrowing flip-flop. Here, two waveforms are shown that correspond to non-TB FF (such as FF 500) and TBFF (such as FF 520). Plot 600 shows D-to-Q delay of the FF as a function of the D-to-Clk separation for both traditional FF and TBFF.

At large D-to-CLK separation, the two FFs behave similarly, as the Clk-to-Q remains relatively constant, and thus the D-to-Q, defined as the sum of D-to-Clk and Clk-to-Q, scales linearly with D-to-Clk. The traditional FF 500 hits its minimum D-to-Q at the point where the master latch hits its setup time and Clk-to-Q starts pushing out. The TBFF 520, on the other hand, can keep sampling the data at lower D-to-Clk separation, as the master sampling clock has been delayed with regards to the external clock signal. The overall D-to-Q continues to improve beyond the minimum achieved by the traditional FF, indicating the TBFF 520 can achieve a lower BHT overall. This is due to the fact that the additional delay in the master clock network leads to a transparency window (TW) during which both the master and the slave latches are transparent at the same time. This allows the TBFF 520 to achieve the absolute minimum BHT limited only by the delay through the data portion of the FF and completely independent of the clock.

Figure 7:
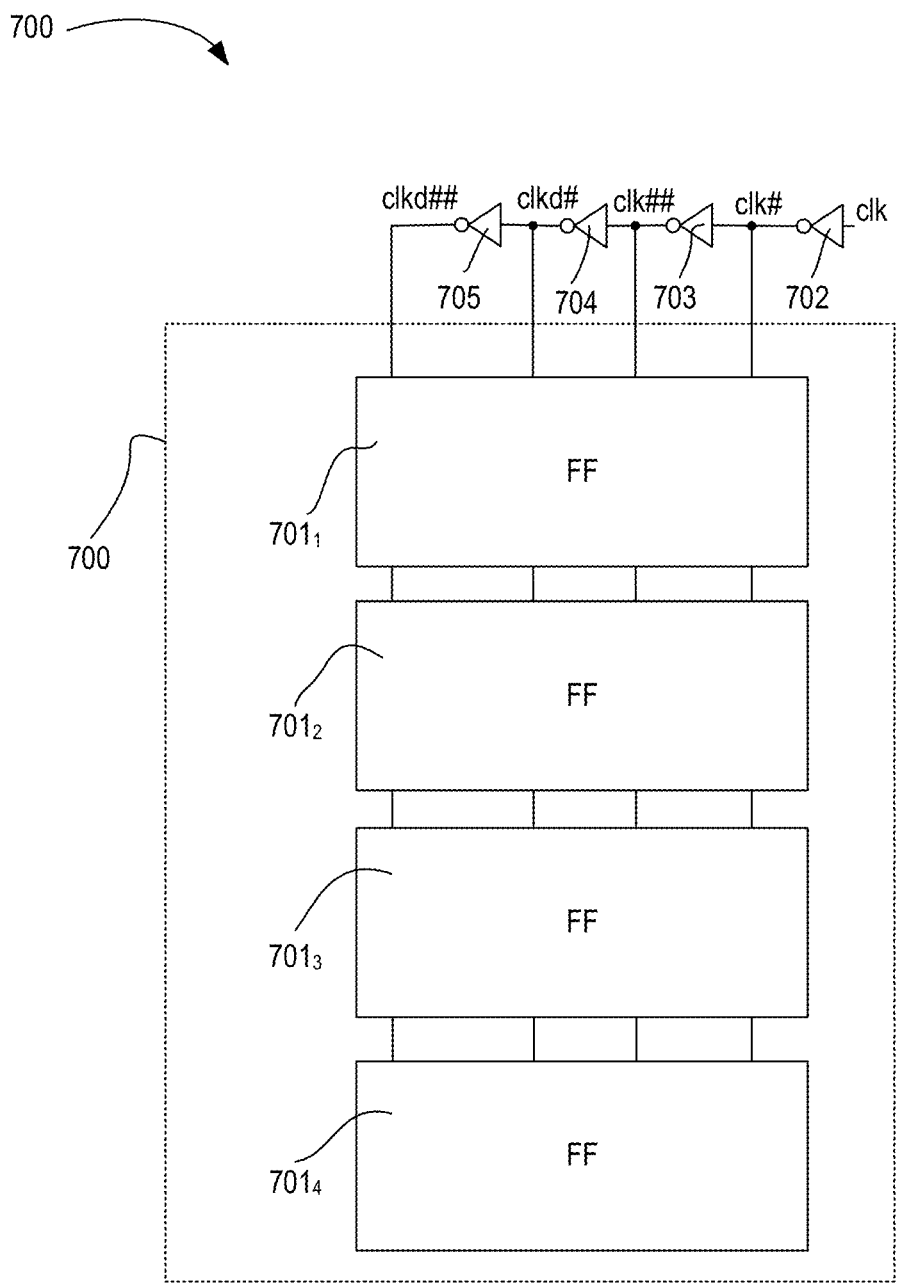
FIG. 7 illustrates a time borrowing vectored flip-flop with shared clocking circuitry, in accordance with some embodiments.

FIG. 7 illustrates a time borrowing vectored flip-flop (TBFF) 700 with shared clocking circuitry, in accordance with some embodiments. The figure shows an example with four flip-flops (quad), however, the vector configuration can be designed with any number of flip-flops. In this design, the local clock inverters 702, 703, 704, and 705 along with two extra time-borrowing clock inverters 526 and 527 are shared across multiple flip-flops. In some embodiments, the two extra time-borrowing clock inverters 526 and 527 are removed, and all clock signals are provided by clock inverters 702, 703, 704, and 705 for all flip-flops of the vector. This sharing amortizes the internal dynamic power overhead of added time-borrowing clock inverters across the number of FF bits. Moreover, these extra clock inverters result in larger flip-flop cell area for a previous single-bit time-borrowing flip-flop.

To enable swapping between non-time-borrowing equivalent flip-flops in critical timing paths, after place-and-route, the original non-time-borrowing flip-flop standard cell area would need to grow to accommodate swapping with a time-borrowing version. This results in significant area overhead and design complexity. The multi-bit time-borrowing flip-flop of various embodiments hides the extra clock inverters in the dead area (or unused area) of the standard cell, therefore paying no upfront area penalty compared to the original multi-bit flip-flop despite having the extra time-borrowing clock inverters.

Figure 8B:
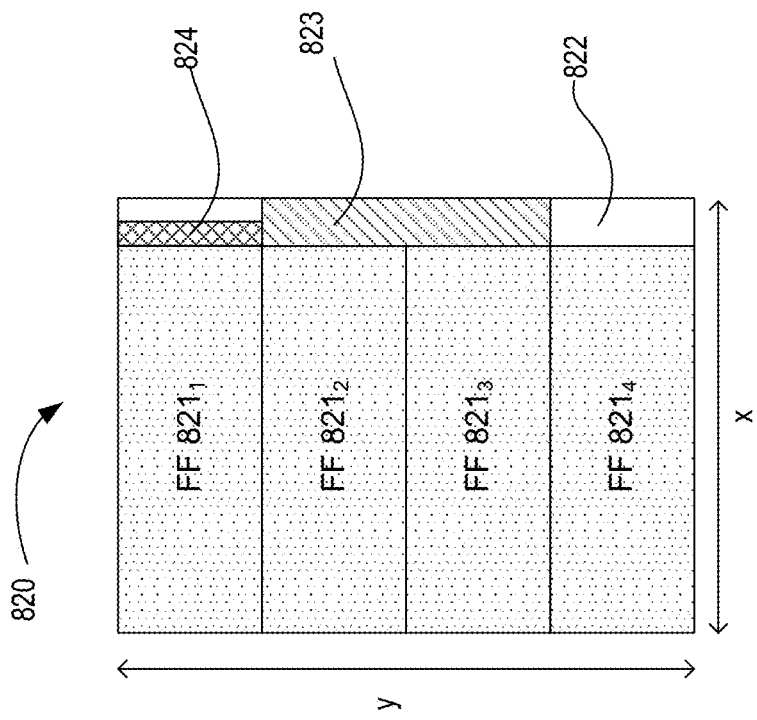
FIGS. 8A-B illustrate floorplans showing comparison of layout floorplan of a traditional quad multi-bit flip-flop vs. time borrowing vectored flip-flop with shared clocking circuitry, in accordance with some embodiments.
Figure 8A:
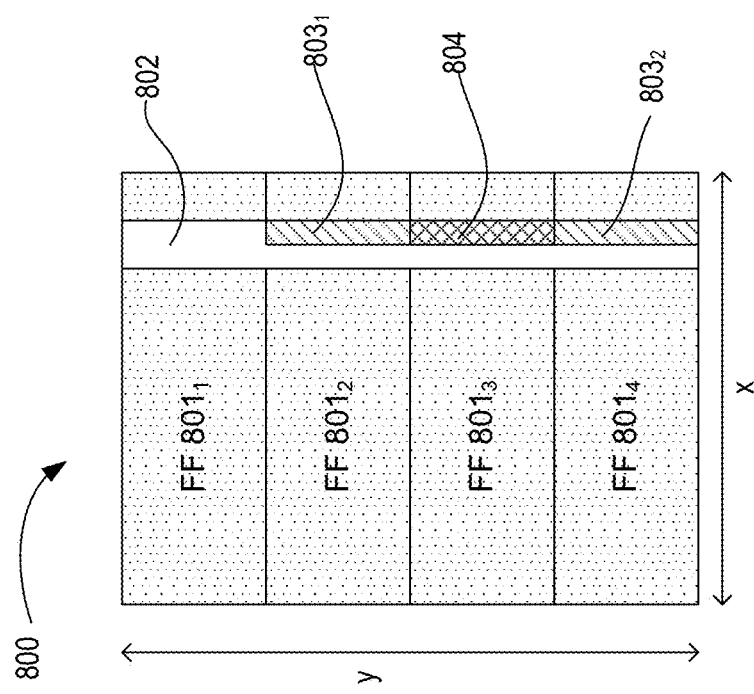

FIGS. 8A-B illustrate floorplans showing a comparison of layout floorplans 800 and 820 of a traditional quad multi-bit flip-flop vs. time borrowing vectored flip-flop with shared clocking circuitry, respectively, in accordance with some embodiments. Floorplans 800 and 820 have identical x and y dimensions. As such, traditional quad multi-bit flip-flop having floorplan 800 can be swapped with time borrowing vectored flip-flop having floorplan 820.

For the traditional quad multi-bit flip-flop, the dead area or unused area is 802, area for clock inverters is $803_1$ and $803_2$, while area for the scan select inverter is 804. For the traditional quad multi-bit flip-flop, the flip-flops are $801_{1-4}$, the dead area or unused area is 802, area for clock inverters is $803_1$ and $803_2$, while the area for the scan select inverter is 804. For the time borrowing vectored flip-flop, the flip-flops are $821_{1-4}$, the dead area or unused area is 822, area for clock inverters is 823, while the area for the scan select inverter is 824. Here, the flip-flops have larger area to have a stronger data path for faster clock to output propagation, and this additional area is compensated by reusing the dead space and moving other devices such that the area is the same. While there are some interface differences, the designs occupy the same area, so the TBFF can be swapped at the cost of limited local re-route without any placement disturbance.

Figure 9:
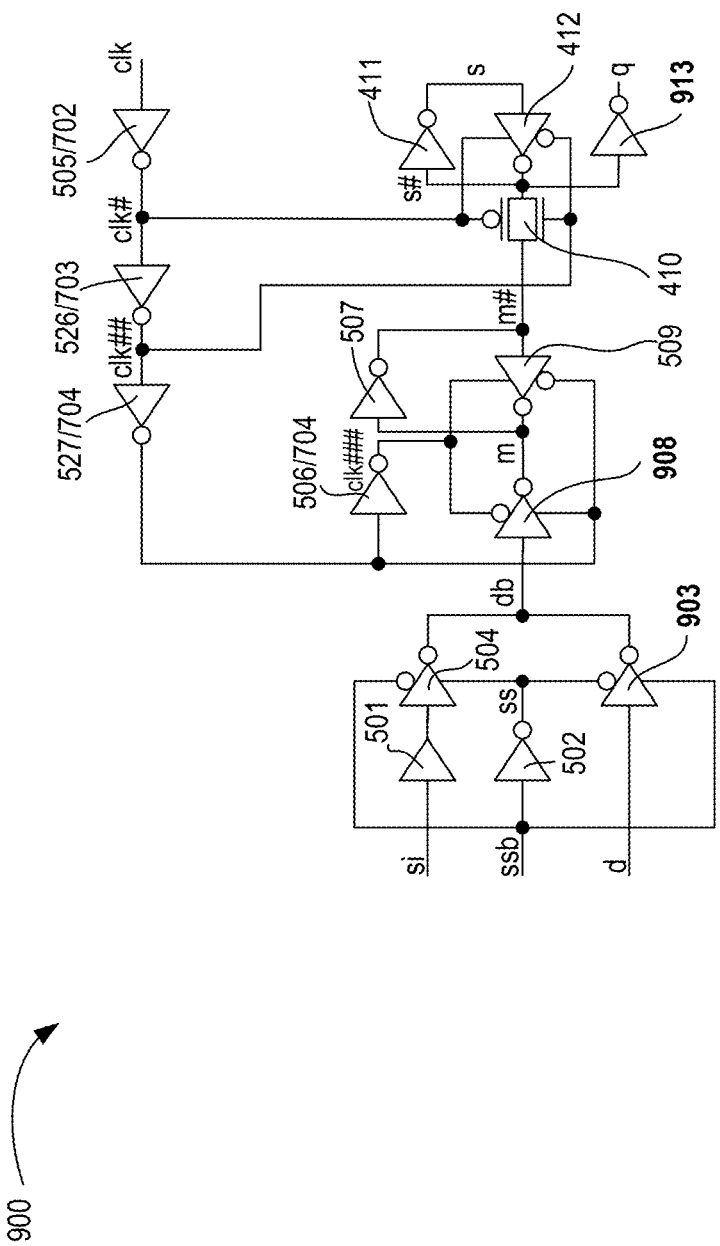
FIG. 9 illustrates a bit-cell of the time borrowing vectored flip-flop with shared clocking circuitry, in accordance with some embodiments.

FIG. 9 illustrates a bit-cell of the time borrowing vectored flip-flop 900 with shared clocking circuitry, in accordance with some embodiments. FIG. 9 shows some additional details on the TBFF implementation. Sizing modifications are done in both the data path as well as the clock path of the flop. In the data path, devices 903, 908, and 915 that may not contribute to clock dynamic capacitance (Cdyn) are upsized giving some extra speed-up to the flop. For example, the width of these devices is increased. This results in additional BHT improvement without significant increase in power or footprint change.

In the clock path, clock inverters 505, 526, 527, and 506 (same as 702, 703, 704, and 705, respectively) are downsized, in accordance with some embodiments. This helps offset some of clock Cdyn cost of the TBFF. Since the internal clock loading inside the TBFF is now distributed between 4 clock inverters instead of 2 clock inverters, each one of the TBFF clock inverters sees a decreased electrical fan-out compared to the traditional FF. As a result, the downsized clock inverters inside the TBFF are still able to meet clock inverter fan-out targets for a library, in accordance with some embodiments.

Figure 10:
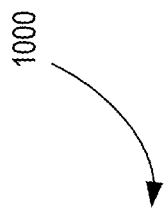
FIG. 10 illustrates a table showing performance enhancement of the time borrowing vectored flip-flop with shared clocking circuitry compared to traditional quad multi-bit flip-flop, in accordance with some embodiments.

FIG. 10 illustrates table 1000 showing performance enhancement of the time borrowing vectored flip-flop with shared clocking circuitry compared to traditional quad multi-bit flip-flop, respectively, in accordance with some embodiments. The table compares delay and power simulation results of quad non-TBFF and TBFF. At nominal supply voltage (e.g., 0.55 V) typical process corner, 100° C., TBFF result in 32% improvement sin BHT compared to its non-TB counterpart. In this example, sharing of added local clock inverters across four flip-flops results in 24%-29% power overhead across 0%-100% data activity. The improvement in BHT with iso-cell-area enables vectored TBFF of various embodiments to use as a means to fix outlier max delay paths, helping to bring those paths closer to overall timing walls during design/debug mode, while at the same time keeping the associated power cost low.

Figure 11:
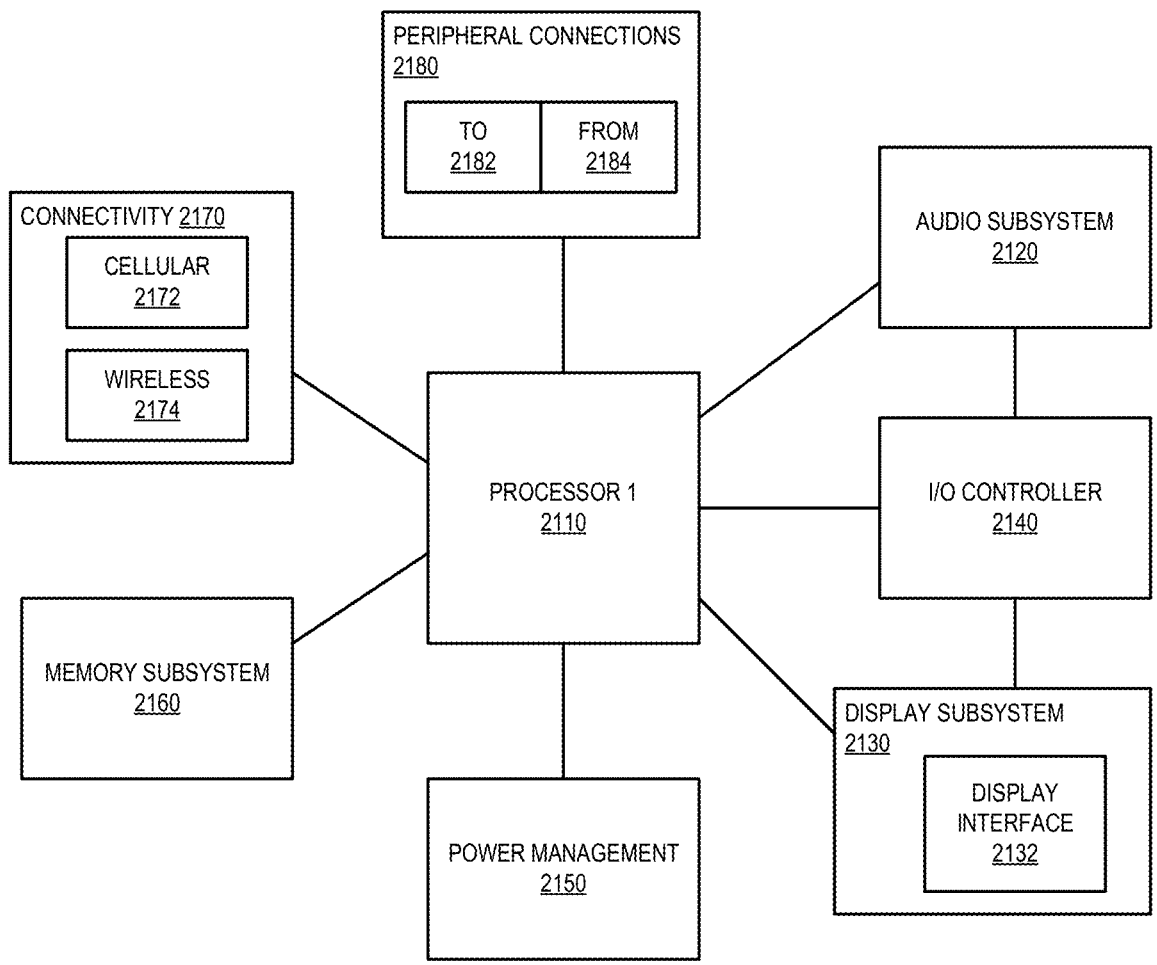
FIG. 11 illustrates a smart device or a computer system or a SoC (System-on-Chip) time borrowing vectored flip-flop with shared clocking circuitry, in accordance with some embodiments.

FIG. 11 illustrates a smart device or a computer system or a SoC (System-on-Chip) with multi-bit quad latch with integrated LSSD scan and/or time borrowing vectored flip-flop with shared clocking circuitry, in accordance with some embodiments. It is pointed out that those elements of FIG. 11 having the same reference numbers (or names) as the elements of any other figure can operate or function in any manner similar to that described, but are not limited to such.

FIG. 11 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 with multi-bit quad latch with integrated LSSD scan and/or time borrowing vectored flip-flop with shared clocking circuitry, according to some embodiments discussed. Other blocks of the computing device 2100 may also include the multi-bit quad latch with integrated LSSD scan and/or the time borrowing vectored flip-flop with shared clocking circuitry according to some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. The various examples associated with each example set may include features from other examples of the same set just like multiple dependent claims of a claim set.

Example 1

An apparatus comprising: a multi-bit sequential including a first sequential circuitry and a second sequential circuitry; and a multi-bit scan circuitry to provide scan of data associated with the multi-bit sequential circuitry, wherein the multi-bit scan circuitry comprises a first bit-cell and a second bit-cell, wherein part of the first bit-cell of the multi-bit scan circuitry is coupled in a feedback path of the first sequential circuitry, and wherein part of the second bit-cell of the multi-bit scan circuitry is coupled in a feedback path of the second sequential circuitry.

Example 2

The apparatus of example 1, wherein an output of the first bit-cell is coupled to an input of the second bit-cell.

Example 3

The apparatus of example 1, wherein the multi-bit sequential comprises a clock buffer shared by the first and second sequential circuitries.

Example 4

The apparatus of claim 1, wherein the feedback path of the first sequential circuitry comprises a slave latch.

Example 5

The apparatus of example 1, wherein the multi-bit scan circuitry comprises buffers to generate control signals, wherein the buffers are shared by the first and second bit-cells.

Example 6

The apparatus of example 1, wherein the part of the first bit-cell, of the multi-bit scan circuitry which is coupled in the feedback path of the first sequential circuitry, comprises a pass-gate.

Example 7

An apparatus comprising: a multi-bit quad latch with an internally coupled level sensitive scan circuitry; and a combinational logic coupled to an output of the multi-bit quad latch.

Example 8

The apparatus of example 7, wherein the multi-bit quad latch comprises a multi-bit sequential including a first sequential circuitry and a second sequential circuitry.

Example 9

The apparatus of example 8, wherein the multi-bit quad latch comprises multi-bit scan circuitry to provide scan of data associated with the multi-bit sequential circuitry, wherein the multi-bit scan circuitry comprises a first bit-cell and a second bit-cell, wherein part of the first bit-cell of the multi-bit scan circuitry is coupled in a feedback path of the first sequential circuitry, and wherein part of the second bit-cell of the multi-bit scan circuitry is coupled in a feedback path of the second sequential circuitry.

Example 10

The apparatus of example 9, wherein an output of the first bit-cell is coupled to an input of the second bit-cell.

Example 11

The apparatus of example 9, wherein the multi-bit sequential comprises a clock buffer shared by the first and second sequential circuitries.

Example 12

The apparatus of example 9, wherein the feedback path of the first sequential circuitry comprises a slave latch.

Example 13

The apparatus of example 9, wherein the multi-bit scan circuitry comprises buffers to generate control signals, wherein the buffers are shared by the first and second bit-cells.

Example 14

The apparatus of example 9, wherein the part of the first bit-cell, of the multi-bit scan circuitry which is coupled in the feedback path of the first sequential circuitry, comprises a pass-gate.

Example 15

A system comprising: a memory; a processor coupled to the memory, the processor including: a multi-bit quad latch with an internally coupled level sensitive scan circuitry; and a combinational logic coupled to an output of the multi-bit quad latch; and a wireless interface to allow the processor to communicate with another device.

Example 16

The system of example 15, wherein the multi-bit quad latch comprises a multi-bit sequential including a first sequential circuitry and a second sequential circuitry.

Example 17

The system of example 16, wherein the multi-bit quad latch comprises multi-bit scan circuitry to provide scan of data associated with the multi-bit sequential circuitry, wherein the multi-bit scan circuitry comprises a first bit-cell and a second bit-cell, wherein part of the first bit-cell of the multi-bit scan circuitry is coupled in a feedback path of the first sequential circuitry, and wherein part of the second bit-cell of the multi-bit scan circuitry is coupled in a feedback path of the second sequential circuitry.

Example 18

The system of example 17, wherein an output of the first bit-cell is coupled to an input of the second bit-cell.

Example 19

The system of example 17, wherein the multi-bit sequential comprises a clock buffer shared by the first and second sequential circuitries.

Example 20

The system of example 17, wherein the feedback path of the first sequential circuitry comprises a slave latch.

Example 21

The system of example 17, wherein the multi-bit scan circuitry comprises buffers to generate control signals, wherein the buffers are shared by the first and second bit-cells.

Example 22

The system of example 17, wherein the part of the first bit-cell, of the multi-bit scan circuitry which is coupled in the feedback path of the first sequential circuitry, comprises a pass-gate.

Example 23

An apparatus comprising: a plurality of sequential logic circuitries; and a clocking circuitry comprising inverters, wherein the clocking circuitry is shared by the plurality of sequential logic circuitries.

Example 24

The apparatus of example 23, wherein the plurality of sequential logic circuitries comprises flip-flops.

Example 25

The apparatus of example 23 comprises a selection circuitry to select one of scan data or regular data for one of the sequential logic circuitries of the plurality.

Example 26

The apparatus of example 23, wherein devices along a data path in each of the plurality of sequential logic circuitries have an area larger than an area of devices which are outside of the data path.

Example 27

An apparatus comprising: means for providing a multi-bit sequential output; and means for providing scan of data associated with the means for providing a multi-bit sequential output.

Example 28

The apparatus of example 1, wherein the means for providing the multi-bit sequential output comprises means for providing a clock to at least two sequential circuitries.

Example 29

The apparatus of example 1, wherein the means for providing the multi-bit sequential output comprises means for generating control signals.

Example 30

A method comprising: providing a multi-bit sequential output; and providing scan of data associated with the means for providing a multi-bit sequential output.

Example 31

The method of example 30, wherein providing the multi-bit sequential output comprises providing a clock to at least two sequential circuitries.

Example 32

The method of example 30, wherein providing the multi-bit sequential output comprises generating control signals.

Example 33

A system comprising: a memory; a processor coupled to the memory, the processor including an apparatus according to any one of examples 1 to 6; and a wireless interface to allow the processor to communicate with another device.

Example 34

A system comprising: a memory; a processor coupled to the memory, the processor including an apparatus according to any one of examples 23 to 26; and a wireless interface to allow the processor to communicate with another device.

Example 35

A system comprising: a memory; a processor coupled to the memory, the processor including an apparatus according to any one of examples 27 to 29; and a wireless interface to allow the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A vectored flip-flop cell apparatus comprising:
a vectored flip-flop comprising two or more flip-flops, wherein an individual flip-flop of the two or more flip-flops receives its own input data and produces a corresponding output;
a clock node to receive a clock; and
an inverter chain including a first inverter, a second inverter, a third inverter, and a fourth inverter coupled in a chain such that an output of the first inverter is coupled to an input of the second inverter, an output of the second inverter is coupled to an input of the third inverter, and an output of the third inverter is coupled to an input of the fourth inverter, wherein an input of the first inverter is coupled to the clock node, wherein the inverter chain is coupled to the vectored flip-flop and shared by the two or more flip-flops, and wherein the inverter chain resides in a space which would otherwise be an empty space of the vectored flip-flop cell apparatus.

2. The vectored flip-flop cell apparatus of claim 1, wherein the individual flip-flop comprises a master latch coupled to the output of the third inverter and an output of the fourth inverter.

3. The vectored flip-flop cell apparatus of claim 2, wherein the individual flip-flop comprises a slave latch coupled to the master latch, and wherein the slave latch is coupled to the output of the first inverter and to the output of the second inverter.

4. The vectored flip-flop cell apparatus of claim 2, wherein the individual flip-flop comprises a scan gadget coupled to the master latch.

5. The vectored flip-flop cell apparatus of claim 4, wherein the scan gadget comprises a first tri-stateable inverter controllable by a scan control, and wherein the first tri-stateable inverter is to receive a scan input.

6. The vectored flip-flop cell apparatus of claim 5, wherein the scan gadget comprises a second tri-stateable inverter controllable by the scan control, wherein the second tri-stateable inverter is to receive a data input, and wherein outputs of the first tri-stateable inverter and the second tri-stateable inverter are coupled to the master latch.

7. An apparatus comprising:
a multi-bit level-sensitive scan gadget that receives a scan control signal and a scan input signal, wherein the multi-bit level-sensitive scan gadget includes two or more bit-cells that are integrated in a sequential manner; and a multi-bit circuitry comprising two or more cells, wherein an individual cell of the multi-bit circuitry is coupled to an individual bit-cell of the multi-bit level-sensitive scan gadget.

8. The apparatus of claim 7, wherein the individual bit-cell of the multi-bit level-sensitive scan gadget comprises:

a tri-stateable inverter controllable by the scan control signal;

a memory coupled to the tri-stateable inverter, wherein the memory includes two cross-coupled inverters;

a pass-gate coupled to an input of the tri-stateable inverter; and a driver coupled to the input of the tri-stateable inverter.

9. The apparatus of claim 8, wherein the individual cell of the multi-bit circuitry comprises:

a tri-stateable inverter controllable by a clock, wherein the tri-stateable inverter is coupled to the pass-gate, the driver, and the tri-stateable inverter of the individual bit-cell of the multi-bit level-sensitive scan gadget;

a first inverter coupled to the tri-stateable inverter, wherein the first inverter is coupled to the pass-gate of the multi-bit level-sensitive scan gadget;

a pass-gate coupled to the tri-stateable inverter and the first inverter; and a second inverter coupled to the pass-gate, wherein the second inverter is to receive a data input.

10. The apparatus of claim 9, wherein the multi-bit circuitry includes a clock buffer shared by the two or more cells of the multi-bit circuitry, and wherein the clock buffer provides the clock.

11. The apparatus of claim 9, wherein the pass-gate of the individual cell of the multi-bit circuitry is controllable by the clock.

12. The apparatus of claim 7, wherein the multi-bit level-sensitive scan gadget includes two buffers shared by the two or more bit-cells of the multi-bit level-sensitive scan gadget, and wherein the two buffers generate the scan control signal.

13. The apparatus of claim 7, wherein the multi-bit level-sensitive scan gadget has an output that indicates a scan output of the two or more bit-cells that are integrated in a sequential manner.

14. The apparatus of claim 7, wherein the multi-bit circuitry generates a multi-bit output, and wherein each bit of the multi-bit output corresponds to cell of the multi-bit circuitry.

15. A system comprising:

a memory;

a processor coupled to the memory, wherein the processor includes:

a multi-bit level-sensitive scan gadget that receives a scan control signal and a scan input signal, wherein the multi-bit level-sensitive scan gadget includes two or more bit-cells that are integrated in a sequential manner; and a multi-bit circuitry comprising two or more cells, wherein an individual cell of the multi-bit circuitry is coupled to an individual bit-cell of the multi-bit level-sensitive scan gadget; and a wireless interface to allow the processor to communicate with another device.

16. The system of claim 15, wherein the individual bit-cell of the multi-bit level-sensitive scan gadget comprises:

a tri-stateable inverter controllable by the scan control signal;

a memory coupled to the tri-stateable inverter, wherein the memory includes two cross-coupled inverters;

a pass-gate coupled to an input of the tri-stateable inverter; and a driver coupled to the input of the tri-stateable inverter.

17. The system of claim 16, wherein the individual cell of the multi-bit circuitry comprises:

a tri-stateable inverter controllable by a clock, wherein the tri-stateable inverter is coupled to the pass-gate, the driver, and the tri-stateable inverter of the individual bit-cell of the multi-bit level-sensitive scan gadget;

a first inverter coupled to the tri-stateable inverter, wherein the first inverter is coupled to the pass-gate of the multi-bit level-sensitive scan gadget;

a pass-gate coupled to the tri-stateable inverter and the first inverter; and a second inverter coupled to the pass-gate, wherein the second inverter is to receive a data input.

18. The system of claim 17, wherein the multi-bit circuitry includes a clock buffer shared by the two or more cells of the multi-bit circuitry, and wherein the clock buffer provides the clock.

19. The system of claim 17, wherein the pass-gate of the individual cell of the multi-bit circuitry is controllable by the clock.

20. The system of claim 15, wherein the multi-bit level-sensitive scan gadget includes two buffers shared by the two or more bit-cells of the multi-bit level-sensitive scan gadget, and wherein the two buffers generate the scan control signal.

21. A vectored flip-flop cell apparatus comprising:

a vectored flip-flop comprising two or more flip-flops, wherein an individual flip-flop of the two or more flip-flops receives an individual input data and produces a corresponding output;

a clock node to receive a clock; and an inverter chain coupled to the clock node, wherein the inverter chain is coupled to the vectored flip-flop and shared by the two or more flip-flops.

22. The vectored flip-flop cell apparatus of claim 21, wherein the inverter chain includes a first inverter, a second inverter, a third inverter, and a fourth inverter coupled in a chain such that an output of the first inverter is coupled to an input of the second inverter, an output of the second inverter is coupled to an input of the third inverter, and an output of the third inverter is coupled to an input of the fourth inverter, and wherein an input of the first inverter is coupled to the clock node.

23. The vectored flip-flop cell apparatus of claim 22, wherein the individual flip-flop comprises a master latch coupled to the output of the third inverter and an output of the fourth inverter.

24. The vectored flip-flop cell apparatus of claim 23, wherein the individual flip-flop comprises a slave latch coupled to the master latch, and wherein the slave latch is coupled to the output of the first inverter and to the output of the second inverter.

* * * * *